US012784723B1

(12) United States Patent
Sakakeeny

(10) Patent No.: US 12,784,723 B1
(45) Date of Patent: Nov. 3, 2026

(54) SPREAD SPECTRUM SOUND REINFORCEMENT SYSTEM AND METHOD FOR MASSED MUSICAL INSTRUMENTS AND/OR VOICES

(71) Applicant: Philharmonia Systems, Inc., Grass Valley, CA (US)

(72) Inventor: Gabriel Sakakeeny, Grass Valley, CA (US)

( * ) Notice: Subject to any disclaimer, the term of this patent is extended or adjusted under 35 U.S.C. 154(b) by 1175 days.

(21) Appl. No.: 17/750,069

(22) Filed: May 20, 2022

Related U.S. Application Data

(60) Provisional application No. 63/192,014, filed on May 22, 2021.

(51) Int. Cl.
*G10H 1/10* (2006.01)
*G10H 3/18* (2006.01)
*H03M 1/12* (2006.01)
*H03M 1/66* (2006.01)

(52) U.S. Cl.
CPC ............... *G10H 1/10* (2013.01); *G10H 3/186* (2013.01); *H03M 1/123* (2013.01); *H03M 1/662* (2013.01); *G10H 2210/325* (2013.01); *G10H 2220/211* (2013.01); *G10H 2250/041* (2013.01)

(58) Field of Classification Search
CPC .... G10H 1/10; G10H 3/186; G10H 2210/325; G10H 2220/211; G10H 2250/041; H03M 1/123; H03M 1/662
USPC .......................................................... 84/708
See application file for complete search history.

(56) References Cited

PUBLICATIONS https://www.gofundme.com/f/osirestm-orchestral-strings-reinforcement-system, Gabriel Sakakeeny, Created May 5, 2020, Retrieved May 27, 2025 (Year: 2020).*

Pigtronix (https://www.pigtronix.com/uploads/pigtronix/2020/11/Echolution-2_D-manual_15-1.pdf, copyright 2015, retrieved Jun. 24, 2026) (Year: 2015).*

Farina et al. ("Inverse numerical filters for linearisation of loudspeaker's response," May 3, 2004, retrieved Jun. 14, 2026 from https://web.archive.org/web/20040503031258/https://www.angelofarina.it/Public/papers/120-DAFX98.PDF) (Year: 2004).*

Declaration of Gabriel Sakakeeny.

Brian Damkroger, 34 Stereophile Magazine (Jul. 2011).

Jim Hannon, *Can High-Performance Audio Help the Performing Arts*, Absolute Sound (Dec. 2011).

Jukka Pätynen, Sakari Tervo, and Tapio Lokki, *A Loudspeaker Orchestra for Concert Hall Studies*, Proc. Instit. Acoustics, vol. 30, Pt. 3 (2008).

Tapio Lokki, Jukka Pätynen, Antti Kuusinen, and Sakari Tervo, *Disentangling Preference Rating of Concert Hall Acoustics Using Subjective Sensory Profiles*, J. Acoustic Soc. Am. 132(5), 3148-61 (Nov. 2012).

Dennis Davis, *OSIRES and Magnepan: Reinforcing Music-Making*, The Audio Beat (May 2011).

* cited by examiner

*Primary Examiner* — Jeffrey Donels
*Assistant Examiner* — Philip G Scoles
(74) *Attorney, Agent, or Firm* — R. Dabney Eastham

(57) ABSTRACT

A system and method are provided for reinforcing the sounds of musical instruments, such as members of the string section of an orchestra, or the voices of singers. Performers and listeners will hear the natural-sounding reinforced sound as if more instruments or singers are performing rather than the performers are being mechanically amplified.

20 Claims, 8 Drawing Sheets

| PITCH DISTIBUTION MATRIX | | | | | | | | | | | | | | | | | | | | | | | | |
|---|---|---|---|---|---|---|---|---|---|---|---|---|---|---|---|---|---|---|---|---|---|---|---|---|
| Detune Cents | -20 | -18 | -16 | -14 | -12 | -10 | -8 | -6 | -4 | -2 | 0 | 2 | 4 | 6 | 8 | 10 | 12 | 14 | 16 | 18 | 20 | | REF | DETUNES | |
| Player 1 | | | | | | | | | | | | X | | | X | | | | | | | | 0 | 2 | 8 |
| Player 2 | | | | | | | | | | | X | | | X | | | | | | | | | 0 | 0 | 6 |
| Player 3 | | | | | | | | | | X | | | X | | | | | | | | | | 0 | -2 | 4 |
| Player 4 | | | | | | | | | X | | | X | | | | | | | | | | | 0 | -4 | 2 |
| Player 5 | | | | | | | | X | | | X | | | | | | | | | | | | 0 | -6 | 0 |
| Player 6 | | | | | | | X | | | X | | | | | | | | | | | | Total | 0 | -8 | -2 |
| # Pitch Outputs | | | | | | | 1 | 1 | 1 | 2 | 2 | 2 | 1 | 1 | 1 | | | | | | | 12 | | | |

Fig. 4

| | 30 inputs 24 outputs | OUTPUTS | | | | | | | | | | | | | | | | | | | | | | | |
|---|---|---|---|---|---|---|---|---|---|---|---|---|---|---|---|---|---|---|---|---|---|---|---|---|---|
| | | S1 | S2 | S3 | S4 | S5 | S6 | S7 | S8 | S9 | S10 | S11 | S12 | S13 | S14 | S15 | S16 | S17 | S18 | S19 | S20 | S21 | S22 | S23 | S24 |
| INPUTS | VLN 1-1 | | | | | | X | | | | | | X | | | | | | | | | | | | |
| | VLN 1-2 | | | | | X | | | | | | X | | | | | | | | | | | | | |
| | VLN 1-3 | | | | X | | | | | | X | | | | | | | | | | | | | | |
| | VLN 1-4 | | | X | | | | | | X | | | | | | | | | | | | | | | |
| | VLN 1-5 | | X | | | | | | X | | | | | | | | | | | | | | | | |
| | VLN 1-6 | X | | | | | | X | | | | | | | | | | | | | | | | | |
| | VLN 2-1 | | | | | | X | | | | | | X | | | | | | | | | | | | |
| | VLN 2-2 | | | | | X | | | | | | X | | | | | | | | | | | | | |
| | VLN 2-3 | | | | X | | | | | | X | | | | | | | | | | | | | | |
| | VLN 2-4 | | | X | | | | | | X | | | | | | | | | | | | | | | |
| | VLN 2-5 | | X | | | | | | X | | | | | | | | | | | | | | | | |
| | VLN 2-6 | X | | | | | | X | | | | | | | | | | | | | | | | | |
| | VLA 1 | | | | | | | | | | | | | X | | | | | | X | | | | | |
| | VLA 2 | | | | | | | | | | | | | | X | | | | | | X | | | | |
| | VLA 3 | | | | | | | | | | | | | | | X | | | | | | X | | | |
| | VLA 4 | | | | | | | | | | | | | | | | X | | | | | | X | | |
| | VLA 5 | | | | | | | | | | | | | | | | | X | | | | | | X | |
| | VLA 6 | | | | | | | | | | | | | | | | | | X | | | | | | X |
| | VCL 1 | | | | | | | | | | | | | X | | | | | | X | | | | | |
| | VCL 2 | | | | | | | | | | | | | | X | | | | | | X | | | | |
| | VCL 3 | | | | | | | | | | | | | | | X | | | | | | X | | | |
| | VCL 4 | | | | | | | | | | | | | | | | X | | | | | | X | | |
| | VCL 5 | | | | | | | | | | | | | | | | | X | | | | | | X | |
| | VCL 6 | | | | | | | | | | | | | | | | | | X | | | | | | X |
| | CB 1 | | | | | | | | | X | X | | | | | | | X | X | | | | | | |
| | CB 2 | | | | | | | | | | | X | X | | | | | | | X | X | | | | |
| | CB 3 | | | | | | | | | | | | | X | X | | | | | | | X | X | | |
| | CB 4 | | | | | | | | | | | | | | | X | X | | | | | | | X | X |
| | Harp 1a | X | | | | X | | | | | | | | | | | | | | | | | | | |
| | Harp 1b | | | X | | | | X | | | | | | | | | | | | | | | | | |

Fig. 5

SPREAD SPECTRUM SOUND REINFORCEMENT SYSTEM AND METHOD FOR MASSED MUSICAL INSTRUMENTS AND/OR VOICES

CROSS-REFERENCE TO RELATED APPLICATIONS

This non-provisional application claims benefit and priority under 35 U.S.C. § 119(e) of U.S. provisional patent application Ser. No. 63/192,014, filed on 22 May 2021 and titled "SPREAD SPECTRUM SOUND REINFORCEMENT SYSTEM AND METHOD FOR MASSED MUSICAL INSTRUMENTS AND/OR VOICES," the contents of which are incorporated by reference for all purposes.

STATEMENT REGARDING DISCLOSURES

A YouTube fundraising video of May 25, 2020 (https://www.youtube.com/watch?v=T40pgP7INd8&t=18s) is a disclosure by the inventor.

BACKGROUND OF THE INVENTION

Symphonic orchestras have an inherent acoustical balance problem due to the large differences in sound power output from the various instruments in the ensemble. The brass, woodwind, and percussion instruments combined can easily produce sound power levels an order of magnitude greater than individual bowed and plucked string instruments.

Prior to the Twentieth Century, the traditional solution to equalizing this power differential has been to hire multiple string players to play the same notes. In larger orchestras, this may mean that up to twenty violinists will play the same musical part. Even with that twenty times duplication of effort, their sound power (only about 2.3 times subjectively louder than one solo player) will fail to equally balance the acoustic power of the brass, woodwinds, and percussion in loudly played sections of the music. This, compounded with the longstanding trend of orchestras playing more loudly over time, has resulted in very large and expensive orchestras (80-110 performers) that cannot support their operations through earned revenue, and endemic string player health problems due to repetitive stress injuries from trying to keep up with the louder instruments of the orchestra.

Since the advent of public address systems in the Twentieth Century, sound engineers have tried to ameliorate the string balance problem by using microphones, mixers, and loudspeakers to reinforce the sound of the various parts of the string section. Often used in orchestra pits for theatrical shows and in outdoor concerts, this approach results in a completely unnatural string instrument tone and a collapse of the oceanic, three-dimensional quality of the orchestral sound, no matter how good the equipment used or the engineer at the mixing desk.

A need exists for systems and methods that enable a small string section to sound like a very large one with no mechanical or electronic artifacts polluting the tone, while preserving the spatial qualities of the orchestral sound. Such systems and methods should enable orchestra companies with smaller personnel budgets or limited stage space to deliver a fully balanced, tonally beautiful orchestral sound in any performance environment, even acoustically unfavorable ones. These systems and methods may also be used to reinforce and enhance the sounds of vocal groups and other ensembles.

BRIEF SUMMARY OF THE INVENTION

An embodiment of the invention for use in live performance is an integrated system of hardware and software that consists of a multi-channel microphone network, a digital signal processing system wherein the multiple channels of audio are individually processed and multiplied, an audio patching matrix, power amplifiers, and a large loudspeaker array for distributing the processed audio in space. A software only implementation of the method can also be realized for digital audio recording purposes.

On each instrument to be reinforced, an omnidirectional microphone is mounted so that the microphone's diaphragm is within the close near field of the sound source. The resulting analog signal is amplified and converted to a digital signal. The signal can then, optionally, be processed by a pitch correction algorithm to adjust its pitch to one of the twelve notes of the musical octave.

The digitized signal is then divided into several discrete channels. The signal in each channel is individually detuned and delayed in time so that its waveform is no longer correlated to the other channels derived from the same source. This is accomplished by pitch shifting (detuning) the original signal in each channel by a unique amount such that a spectral analysis of the sum of the plurality of all its channels would contain a normal distribution of many spectral components in the sidebands above and below the fundamental pitch and harmonics of the original signal. Before or after pitch shifting, the signal in each channel is delayed by an amount that is a multiple of the Golden Ratio, Phi $$(\varphi) = \varphi = \frac{1+\sqrt{5}}{2} = 1.618033 \ldots \Big)$$

such that the transfer characteristic of the sum of the plurality of channels would be frequency linear due to the absence of reinforcing or cancelling fundamental and harmonic spectral components.

The exact amount of detuning and time delay is set so that the sum of all the channels when acoustically added to the sum of all the channels from other original signals playing the same notes, results in a spread spectrum of energy that approximates a normal distribution above and below the target pitch.

Signals from each channel are optionally filtered through a frequency equalizer to allow for tone control settings and then routed and mixed by a digital audio matrix to one of a multiplicity of output channels. Each output channel is then filtered through the inverse transfer characteristic of its corresponding loudspeaker in the loudspeaker array to correct the speaker's power response. Each output channel is then converted from digital to analog audio, amplified, and distributed to its corresponding speaker. The loudspeaker array is placed in the performing space, and its output level adjusted so that, at the listener's position in the hall, its output approximates the characteristic ratio of direct to diffuse field sound power for the instruments being reinforced.

Typical embodiments of the invention for live performance will have from twelve to thirty-two input channels and from sixteen to thirty-two output channels each driving its own assigned loudspeaker. A software plugin embodiment of the method described above can be implemented for use in digital audio workstations.

BRIEF DESCRIPTION OF THE DRAWINGS

FIGS. 3*a* and 3*b* are two parts of a schematic of signal processing for six input channels from six musical instruments in which FIG. 3*a* shows stages I-VII and FIG. 3*b* shows stages VIII-XII.

FIG. 4 is a table showing the pitch distribution for the signals from six players.

FIG. 5 is a table showing the channel assignments from player channels to output speaker array channels.

DETAILED DESCRIPTION OF THE INVENTION

Figure 1:
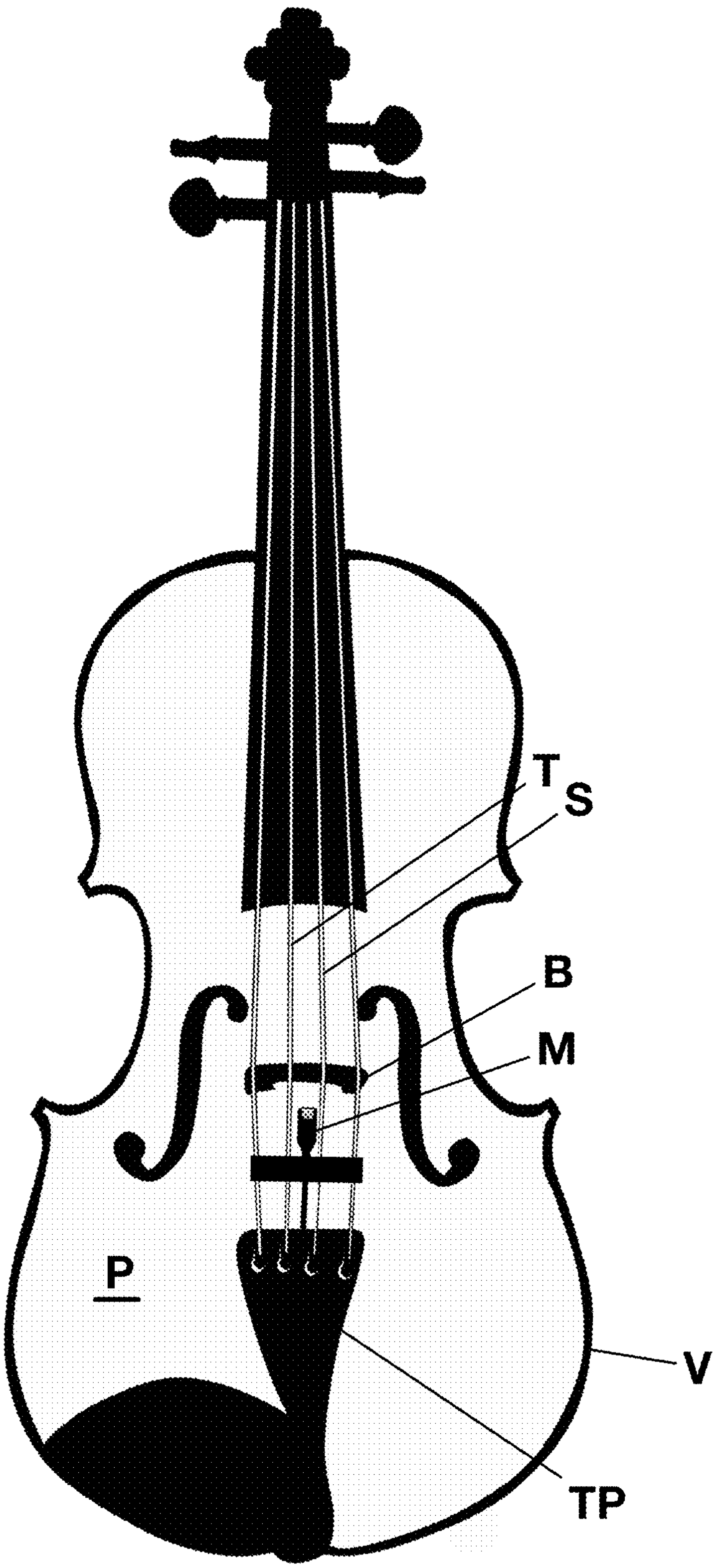
FIG. 1 shows a plan view of a violin with a microphone mounted between the second and third strings of the violin.

An embodiment of the spread spectrum reinforcement system 100 and the method according to this disclosure will be described in connection with an orchestra comprising a string section that is to be reinforced in order for the string section to sound like it has more players and thus permit an orchestra with a reduced number of strings players to sound like a large symphonic orchestra. It will be understood that the system and method also could be applied to other kinds of instruments and to vocalists. But, first, the acoustics of choral sounds in music must be understood in order to explain the system and method of the disclosure.

Introduction to the Acoustics of Choral Sounds in Music

In a concert hall or other reverberant acoustic environment, two sources of energy reach the ears of the audience: 1) the direct sound from the instruments themselves, and 2) the sum of all the sounds reflected from the walls, floor, and ceiling of the room itself. The latter is known as the diffuse reverberant field. The direct sound falls off in intensity as the inverse square of the distance from source to listener. The steady-state sound pressure level in the diffuse reverberant field of the room, however, may be assumed to be constant at all points in the space of the room.

When, at the listener's location, the ratio of the direct sound to the diffuse reflected sound from an instrument equals 1:1, then the listener is said to be at the critical distance from the instrument in that space. When the listener is seated at distances greater than the critical distance, the sound power of the diffuse reflected field dominates. Practically, this means that at most seats in a concert hall, the audience is mostly hearing the diffuse sound of the reverb field with only a small amount of direct sound from the instruments themselves providing directional cues. This reverberation-rich mix makes the music sound most pleasing to the players and the audience.

The critical distance is governed by two parameters; the reflectivity of the concert hall surfaces, and the directivity of the sound radiating from the instrument. Given that the concert hall acoustics are generally the same for all instruments, the radiation directivity of musical instruments determines how loud those instruments sound at the listener's position in the hall. Instruments that radiate all their energy toward the audience will be heard more loudly than instruments that disperse their energy in all directions, all other things being equal.

String instruments (violin, viola, violoncello, contrabass, and harp) radiate almost omnidirectionally in a near-spherical polar pattern ($4\pi$ steradians.) Only a small chord of that sphere points directly at a listener's head, so only a small amount of the sound power is heard directly, making the critical distance very short and the diffuse reverb field the predominant sound for most of the audience. On the other hand, brass instruments with highly directional horns (such as trumpets and trombones), radiate the majority of their sound power into a much smaller space (about $\pi/2$ steradians). This means that the critical distance for the brass instruments is much larger than for the string instruments. Sitting in the same location, the listener will hear a much greater ratio of direct sound to diffuse reverberant sound from a brass instrument pointed directly at the listener. Brass instruments put out more sound power naturally because they require much more kinetic energy to actuate than strings, and their horns couple that energy to the ambient air more efficiently than do the vibrating bodies of string instruments.

To equally balance the string instruments with the more efficient, directional instruments, the instantaneous sum of both the direct and diffuse fields from the strings must be about equal to that coming from the other instrumental sections at the listeners' location. This can be achieved by using amplifiers and speakers to augment the string section output. However, to preserve the tone and quality of the string choir using artificial means, the ratio of direct to diffuse field sound must be the same as before amplification at the listener's location. The location of the amplified sound sources (loudspeaker arrays) must be evenly distributed throughout the space so that there is no unexpected concentration of sound in the diffuse field. In addition, the distribution of energy across the frequency spectrum should match or closely approximate the acoustic signature of the original string choir for the amplified effect to be accepted by the listener as realistic.

To summarize, to imitate a large group or choir of instruments with a smaller group requires 1) the same ratio of direct to reflected sound as the large group, 2) a spread spectrum of pitch sources that imitates the same pitch distribution as the original group, and 3) distribution of the amplified sound sources in space so as to project the same ratio of direct to diffuse field at the listener's position as the original group.

The discussion of the reinforcement system and method begins with obtaining the input signals from the strings section. The signal processing then follows.

Input

Many instrument microphones and pickups designed for live performance are optimized to suppress feedback or isolate off-microphone sounds. They are not well suited for the system and method of this disclosure due to their tonal colorations. To ensure the most natural and neutral sound from each string instrument, omnidirectional small diaphragm condenser microphones that have a frequency response that is plus or minus two decibels (dB) over the frequency range of interest and a signal to noise ratio of greater than 60 decibels (dB) or better are preferred. The frequencies of interest for string instruments are:

Violins: 185 Hz to 5,000 Hz;

Violas: 130 Hz to 5,000 Hz;

Violoncellos: 65 Hz to 5,000 Hz; and

Contrabasses: 30 Hz to 5,000 Hz.

At least two, and up to eight instruments playing the same musical part preferably should be connected to the system from each of the six sub-sections (first violin, second violin, viola, violoncello, contrabass, and harp) of the string section of the orchestra. Unlike unreinforced acoustic string sections, acoustical power is a function of system gain when using the reinforcement system 100, so applying microphones to a generally equal number of players of the same instrument in each string section subdivision is recommended.

Since the harp is one instrument with 47 plucked strings and is not usually used in a choral group like the bowed strings, it is preferably reinforced with two microphones—one to pick up the upper 24 strings (upper register), and another microphone to pick up the lower 23 strings (lower register.)

The complement of the string section of a traditional symphonic orchestra consists of 16 first violins, 14 second violins, 12 violas, 10 violoncellos, and 8 contrabasses (60 players).

The complement of the string section of a reinforced orchestra could consist of 6 first violins, 6 second violins, 6 violas, 6 violoncellos, and 4 contrabasses (28 players) which, after reinforcement, could have the equivalent sound power of 18 first violins, 18 second violins, 18 violas, 18 violoncellos, and 12 contrabasses. An ensemble comprised of unreinforced instruments in these numbers (18 first violins, 18 second violins, 18 violas, 18 violoncellos, and 12 contrabasses) would sound bass heavy due to the total radiating surface area of the lower instruments being much larger than the higher instruments, the latter group's resonating efficiency notwithstanding. System 100 can be configured to provide an equal amount of radiating area per string section, so the number of instruments per section is given by the minimums described below and the musical part allocation preferences of the user.

Reinforcing only one live instrument per musical part results in an artificial sounding "virtual section" wherein all the instruments have the same vibrato speed and performance articulations. With at least two players per musical part input to the system, the lack of correlation between vibrato speeds and bowing inflections creates enough complexity in the acoustical result to provide a convincing simulation of the full strings section of a traditional orchestra. Adding more players, up to eight, thickens the texture and makes the tone of the musical part more robust against players dropping out or making errors. More than eight players per musical section inputting to the system has diminishing returns both musically and financially.

FIG. 1 shows a plan view of a string instrument, namely a violin V. The microphone M preferably should be mounted facing the top plate P of the instrument V, between the bridge B and the tail piece TP, and between the second string S and the third string T of the instrument, with the diaphragm of the microphone M well within the near field of the instrument no further than two centimeters (2 cm) from the top plate P of the instrument V.

A microphone muting footswitch (not shown in the drawings) preferably should be inserted in series with the microphones of section leaders for the purpose of playing solos.

The signals of the microphones M can be conveyed to the main digital processor by means of a wireless microphone network, through an Ethernet-based audio network, or through analog cabling. The signals are delivered to microphone preamplifiers of the main digital processor's audio interface and thence to analog/digital (A/D) converters, as described in more detail below.

Description of System and Method for One Instrument Channel

By "one instrument channel" is meant the processing of the signal from the microphone M attached to a single musical instrument such as the violin V discussed above.

Figure 2:
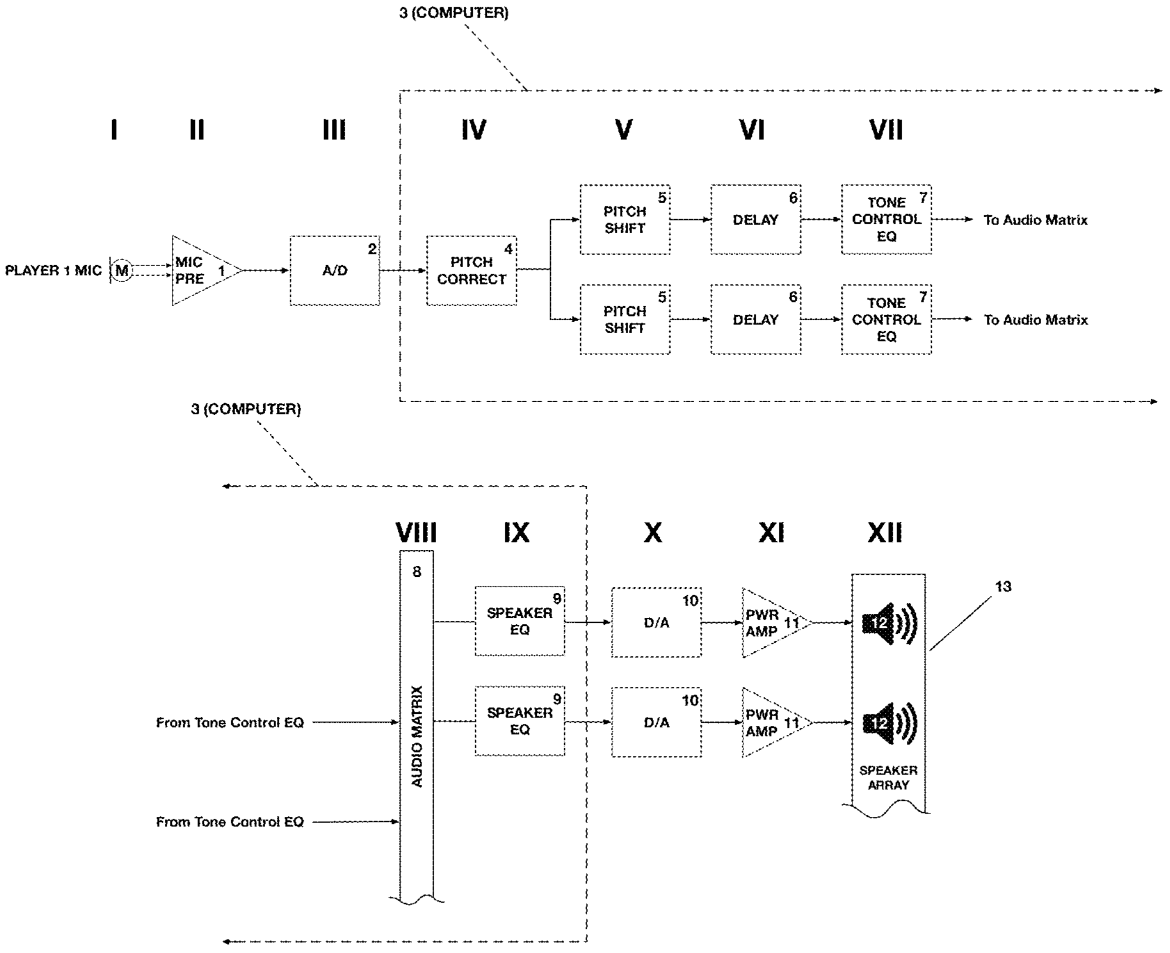
FIG. 2 is a schematic depicting the system and method for the signal flow for a single musical instrument.

FIG. 2 in the drawings depicts the reinforcement system according to the disclosure in connection with one instrument channel. In stage I of the system, a suitable omnidirectional microphone M is attached to the instrument as described above.

In stage II the microphone output is connected to an adjustable gain stage 1. A commercially available acceptable device is the Antelope Audio MP32 microphone preamplifier.

In stage III the gain stage output is connected to the input of an analog to digital (A/D) converter 2 sampling at least 44.1 KHz at a bit depth of preferably at least sixteen bits. The now-digital signal or channel will be input into a general-purpose computer 3 that is running software that will alter and double each now-digitized instrument channel signal.

Stage IV is optional. The digitized signal is input to a real-time pitch correction software module 4 such as Auto-Tune, a proprietary software plugin to measure and alter pitch in vocal and instrumental music recording and performances, made by Antares Audio Technologies. The parameters of the application are set to tune the signal to a system reference pitch with a pitch offset as described below in the section on Pitch Matrices.

In stage V the tuned signal is input to a mono-to-multichannel pitch shifting module 5 such as the Doubler plug-in offered by Waves Audio Ltd. The parameters of the module 5 are set to shift the pitch in each channel up to 20 cents described below in the Pitch Matrices Section, wherein a cent is one one-hundredth of an equal tempered semitone.

In stage VI the detuned signal in each leg of the multichannel pitch shifting module is input to a delay module 6 and delayed as described below in the section on Pitch Matrices.

In stage VII the delayed signal in each leg of the delay module is input to a parametric equalization module 7 to allow for tone control adjustments to ameliorate acoustical flaws in the venue.

In stage VIII the output of each equalization module 7 is input to an audio matrix 8 for output assignments as described below in the section on Output Assignments.

In stage IX the signal of each output of the audio matrix 8 is connected to a speaker equalization module 9 that filters the signal through the inverse transfer characteristic of its related output loudspeaker 12. This filter ensures that each output loudspeaker 12 has a flat frequency response, meaning that the output loudspeaker 12 accurately transduces an electrical input to its acoustic output without any emphasis or de-emphasis of amplitude or rotation of phase across the frequency spectrum of interest within acceptable tolerances.

In stage X the equalized signal in each output channel is input to a digital to analog converter 10. In stage XI the now-analog signal is connected to a power amplifier 11.

In stage XII the signal output of each power amplifier 11 is connected to a speaker 12 in a speaker array 13.

Each speaker 12 in the speaker array 13 is positioned as described below in the Loudspeaker Array section.

Embodiment of the System for a Mid-Sized Orchestra

This section describes an embodiment of the system 100 according to the disclosure for use with a medium-sized Twentieth Century orchestra having the following instrumentation:

3 flutes, 3 oboes, 3 clarinets, 3 bassoons;
4 horns, 3 trumpets, 3 trombones, 1 tuba;
1 timpanist, 4 percussionists playing various instruments;
1 harpist, 1 pianist doubling on celesta;
12 first violins;
10 second violins;
8 violas;
8 violoncellos; and
6 contrabasses.

The system 100 will give the string section (first and second violins, violas, violoncellos, contrabasses, and harp) the sound equivalent to that of the string section in a very large symphonic orchestra.

System Components

The physical and software components of this embodiment of the system 100 for a mid-sized orchestra are listed below.

1. Microphones M for Each of the Instruments V that is to be Reinforced.

Satisfactory microphones for the violins, violas, and the harp are Countryman™ I2 violin/viola omnidirectional microphones with appropriate mounting hardware. Twenty of these microphones preferably should be provided: six for the first violin section, six for the second violin section, six for the viola section, and two for the harp.

Satisfactory microphones for the violoncellos and contrabasses are Countryman™ I2 violoncello/contrabass omnidirectional microphones with appropriate mounting hardware. Ten of these microphones preferably should be provided: six for the violoncello section and four for the contrabasses.

2. A Multichannel Adjustable Microphone Preamplifier 1 to which the Microphones M Will be Connected.

An example of a satisfactory adjustable microphone preamplifier is an Antelope Audio® MP32 which has thirty-two channels, although only thirty of the channels will be used in this embodiment of the reinforcement system 100.

3. A Multichannel Analog-to-Digital (A/D) Converter 2 to which the Outputs of the Multichannel Adjustable Microphone Preamplifier 1 Will be Connected.

An example of a satisfactory multichannel analog-to-digital (A/D) converter is the Presonus® Quantum 4848 multichannel Thunderbolt audio interface which has 32 analog inputs and outputs. Only thirty of those channels, however, would be needed.

4. A General-Purpose Computer 3 which is Loaded with Software to Duplicate and Alter the Outputs of the Thirty Channels Coming from the Multichannel Analog-to-Digital (A/D) Converter 2.

An example of a satisfactory and commercially available general-purpose computer is the Apple® Mac Mini 3.2 GHz 6-core Intel Core i7, 32 GB RAM, 256 GB storage. The software loaded on the general-purpose computer 3 preferably includes an audio plugin host environment program. An example of a satisfactory commercially available host environment program is the Waves Audio™ SuperRack audio plugin host environment.

5. Other Audio Plugin Software Programs Perform Various Functions on the Now Digital Channels.

These functions include the optional real-time pitch correction 4, the mono-to-multichannel pitch shifting 5, the delay 6, the parametric equalization 7, the audio matrix 8 for output assignments, and the speaker equalization 9. Commercially available software that is satisfactory for carrying out these functions are available from Waves Audio, Ltd., namely a Waves Plugin® Doubler plugin, detuning, and delaying, and equalization software; Antares Audio Technologies Auto-Tune pitch correction software; and a Waves Plugin® TRACT System Calibration speaker calibration software.

6. The Digital to Analog Conversion.

The conversion is performed by the Presonus® Quantum 4848 Thunderbolt multichannel interface.

7. Power Amplifiers 11.

Satisfactory commercially available power amplifiers are the Crown® CT 875 8-channel power amplifier, 75W@ 4 ohms. Three of these preferably should be provided.

8. Loudspeakers 12.

A satisfactory commercially available loudspeaker is the Magnepan® LRS loudspeaker pair. Twelve of these loudspeaker pairs should be provided for a total of twenty-four loudspeakers 13. The individual speakers 13 are labeled S1-S24 in FIGS. 5 and 6, 9. Appropriate Cables, Rack Cabinets, and Interface Panels.

These items are necessary but are not listed because any person of ordinary skill will understand the number and kind of these items that are needed based on the equipment described above and its setup as described next.

Microphone Setup

The players on the first three desks of each part of the string section will carry microphones on their instruments. Mount a microphone as described above on each instrument V. Using stage boxes and snakes, convey the signal from each microphone to a discrete input channel of the reinforcement system 100 as described below in Table 1.

TABLE 1

| |
|---|
| VIOLIN 1 |
| Input 1: Concert master |
| Input 2: Asst. concert master |
| Input 3: 2nd desk outside |
| Input 4: 2nd desk inside |
| Input 5: 3rd desk outside |
| Input 6: 3rd desk inside |
| VIOLIN 2 |
| Input 7: Principal |
| Input 8: Asst. principal |
| Input 9: 2nd desk outside |
| Input 10: 2nd desk inside |
| Input 11: 3rd desk outside |
| Input 12: 3rd desk inside |
| VIOLA |
| Input 13: Principal |
| Input 14: Asst. principal |
| Input 15: 2nd desk outside |
| Input 16: 2nd desk inside |
| Input 17: 3rd desk outside |
| Input 18: 3rd desk inside |
| VIOLONCELLO |
| Input 19: Principal |
| Input 20: Asst. principal |
| Input 21: 2nd desk outside |
| Input 22: 2nd desk inside |
| Input 23: 3rd desk outside |
| Input 24: 3rd desk inside |
| CONTRABASS |

TABLE 1-continued

| |
|---|
| Input 25: Principal |
| Input 26: Asst. principal |
| Input 27: 2nd desk outside |
| Input 28: 2nd desk inside |
| HARP |
| Input 29: upper register |
| Input 30: lower register |

NOTE: Harp microphones can be hung inside the resonating chamber of the instrument.

If section principals must play solos during the performance, insert a foot operated microphone muting switch between the respective player's microphone output and the snake or stage box. This will allow the player to mute his or her microphone signal during the solo.

Figure 3A:
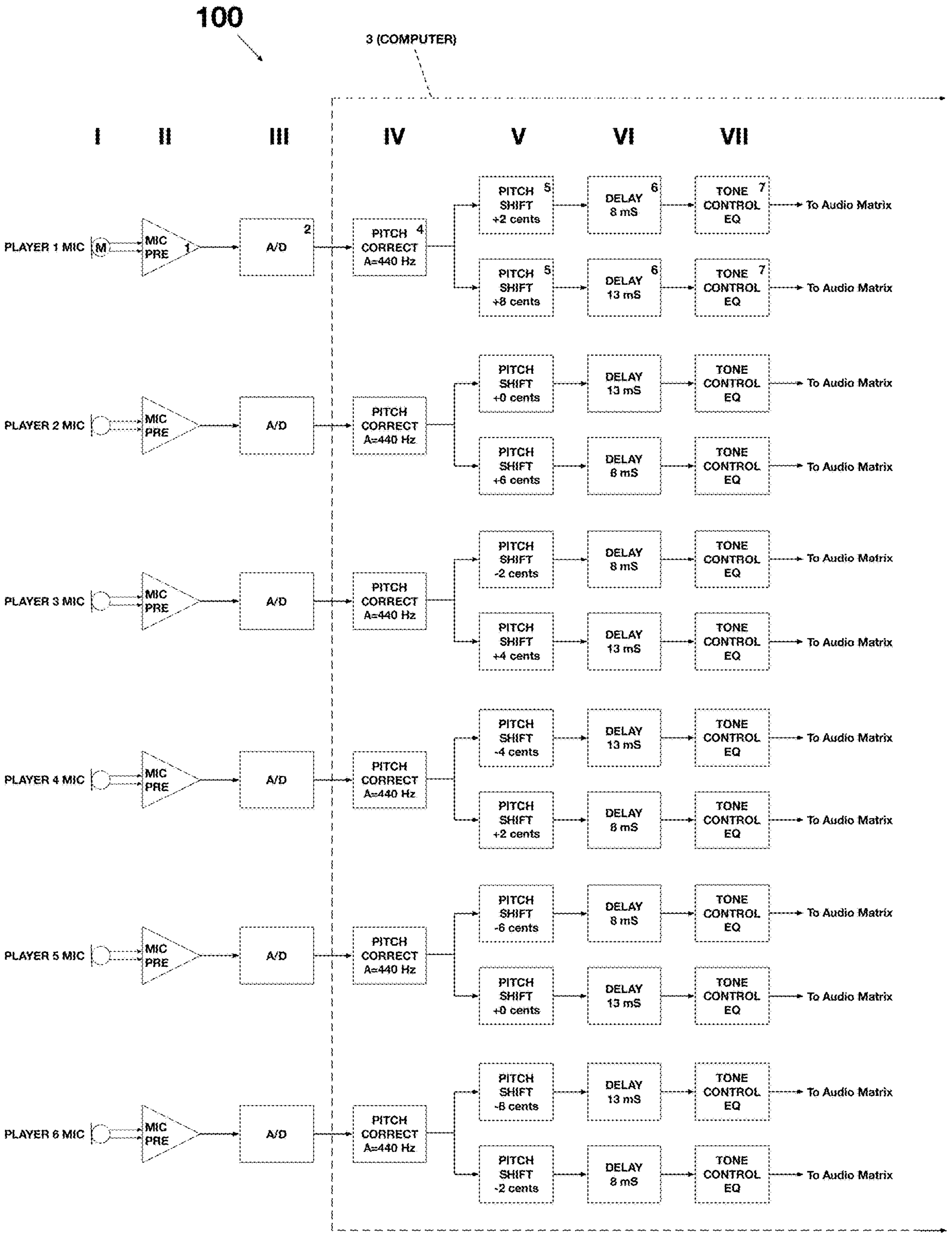
Figure 3B:
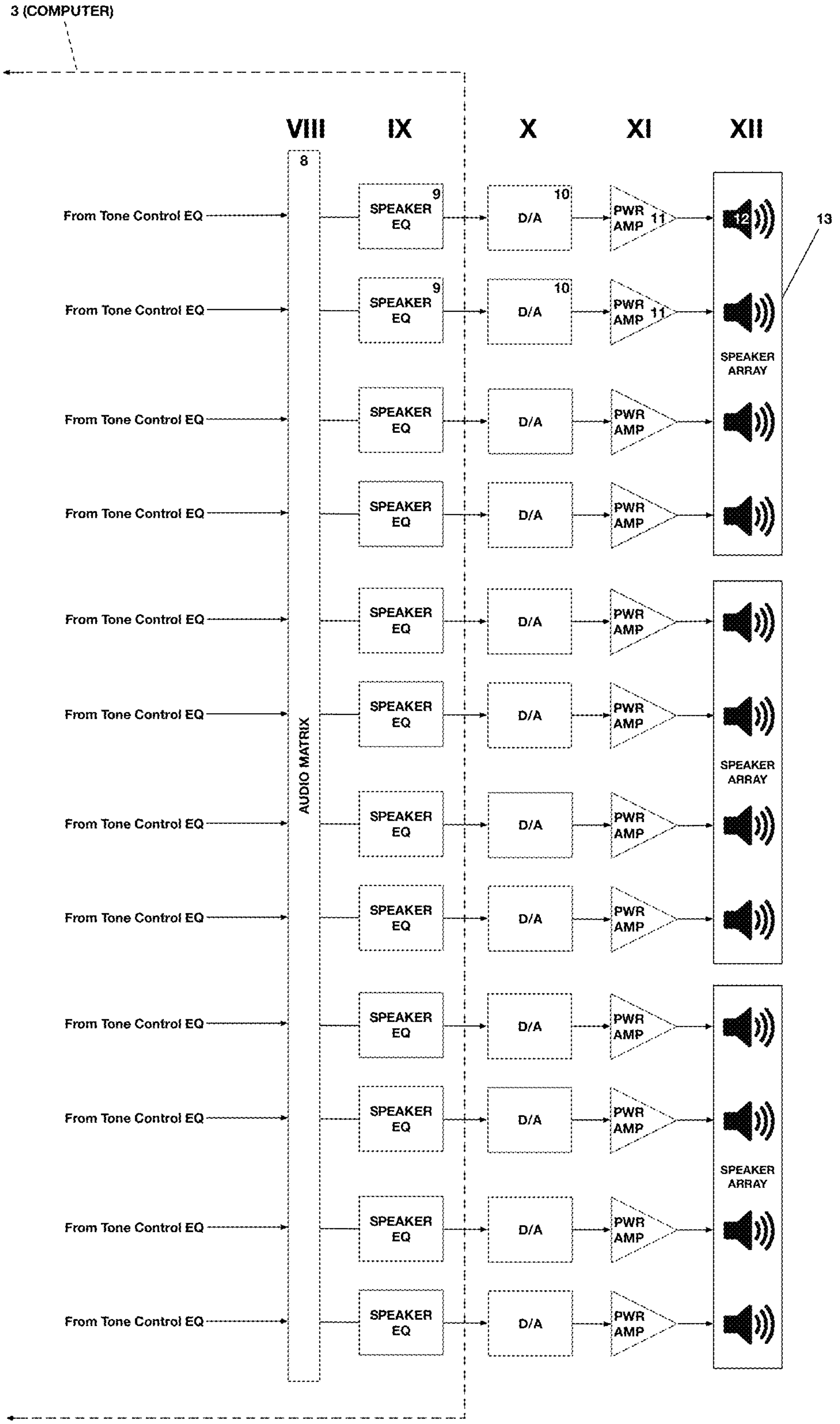

FIGS. 3*a* and 3*b* in the drawings are two parts of a schematic showing part of the embodiment of the reinforcement system 100 for a mid-sized orchestra, namely the system for processing the signals from six players (such as six of the players of the violoncello section). The full embodiment is a system 100 for processing the signals from the thirty players identified above. The following steps are for connecting and adjusting the parts of the system for six players:

Amplification and Analog to Digital Conversion

Connect each microphone channel to its correlated preamplifier channel. Connect the output of each preamplifier channel to the corresponding input of the analog to digital converter. Adjust the gain of the microphone preamplifier so that the peak levels produced by each player at their loudest do not exceed more than −12 decibels relative to full scale (dBFS) at the output of the analog to digital convertor. The 12 dB of headroom allows for ambient sounds during loud passages in the music not clipping the input of the A/D converter.

Software Configuration

Using a virtual studio technology (VST) host application like the Waves Plugin® SuperRack™, Plogue Bidule™, or other, assign each of the outputs of the analog to digital converters 2 to a consecutive signal processing channel. There will be up to six channels per section of the string orchestra. For example, violin 1 will have six channels, contrabass will have four, and harp will have two. This discussion is for six players.

Optional Pitch Correction

If using pitch correction, connect each discrete channel to the input of a pitch correction plugin 4 like Antares Audio Technologies Auto-Tune™. Adjust the reference pitch to A=440 Hz or to the orchestra's standard reference pitch. This processing step results in six individual players' signals that will all be tuned to the same reference pitch. This optional step is desirable because the overall pitch center of the orchestra as a whole will be stabilized over stage temperature variations and the changing technical demands on the players.

Spread Spectrum Detuning

Connect the output of each pitch correction plugin to the mono input of a stereo doubling or chorusing plugin 5 such as the Waves Plugin® Doubler available from Waves Audio, Ltd. Adjust the pitch shifting modules for each of the six signals as shown in the pitch distribution matrix of FIG. 4, wherein:

Player 1: Left +2 cents, Right +8 cents;
Player 2: Left 0 cents, Right +6 cents;
Player 3: Left −2 cents, Right +4 cents;
Player 4: Left −4 cents, Right +2 cents;
Player 5: Left −6 cents, Right 0 cents; and
Player 6: Left −8 cents, Right −2 cents.

This distribution of pitch results in a spread spectrum of energy around the reference pitch that approximates the normal pitch distribution produced by a real instrumental section. For aesthetic reasons, wider or more narrow distributions of pitch can be obtained by arranging the detune amounts of the twelve available signal paths around the reference pitch using the pitch distribution matrix.

This processing step results in twelve processing channels which, ultimately will connect to twelve or more output loudspeakers.

Phase De-Correlation

To produce a convincing acoustic output, the signals from each individual player must be delayed in time. The delays must be set to avoid unwanted resonances in the output of the system arising from acoustic coupling between regularly spaced drivers in the output speaker arrays.

The system 100 should avoid reinforcements and cancellations of frequencies in the passband that are harmonically related to the reciprocals of the delay times and their sum and difference frequencies.

To achieve these results, the ratios of the delay times in a single player's channels preferably should equal or closely approximate 1.618033998 . . . : the value of Phi (φ), the Golden Mean or Golden Ratio, as shown in Table 2 below. This will ensure that the sum and difference frequencies related to the reciprocals of the delay times will never have a harmonic relationship to each other or to the player's original signal. Other irrational or prime numbers could be used such that the transfer characteristic of the sum of the plurality of channels would be frequency linear due to the absence of reinforcing or cancelling spectral components, but quickly run into the echo threshold of human hearing wherein delays longer than 50 mSec are heard as echoes rather than a single sound event. Calculating the delays as a multiple of Phi (cp) or its conjugate (0.618033998 . . . ) results in no sum and difference reinforcements or cancellations due to phase differences between equally spaced loudspeakers in the speaker arrays of the system, and generally stay below the echo threshold yielding an uncolored, natural sounding result.

TABLE 2

| NONRESONANT DELAY RATIOS | | | | Frequency |
|---|---|---|---|---|
| Phi | Delay (mSec) | Rounded | Δ | (Hz) |
| 1.618034 | 5 | 5 | | 200 |
| | 8.09017 | 8 | 3 | 123.6 |
| | 13.09017013 | 13 | 5 | 76.4 |
| | 21.18034033 | 21 | 8 | 47.2 |
| | 34.27051078 | 34 | 13 | 29.2 |

To avoid undesirable comb filtering (a comb filter is implemented by adding a delayed version of a signal to itself that causes constructive and destructive interference) between the system output and the sound of the instrument being played, the minimum delay should be equal to or greater than the reciprocal of the lowest frequency that the instrument produces.

Minimum frequencies and delays are:

Violin: 196 Hz (~5 mSec);
Viola: 131 Hz (~8 mSec);
Violoncello: 65 Hz (~15 mSec);
Contrabass: 42 Hz (~24 mSec); and Harp: 30 Hz (~33 mSec).

Adjust the delay modules of each of the six channels preferably as shown below.

For violins:

Player 1: Left 5 mSec, Right 8 mSec;

Player 2: Left 8 mSec, Right 5 mSec;

Player 3: Left 5 mSec, Right 8 mSec;

Player 4: Left 8 mSec, Right 5 mSec;

Player 5: Left 5 mSec, Right 8 mSec;

Player 6: Left 8 mSec, Right 5 mSec;

For violas:

Player 1: Left 8 mSec, Right 13 mSec;

Player 2: Left 13 mSec, Right 8 mSec;

Player 3: Left 8 mSec, Right 13 mSec;

Player 4: Left 13 mSec, Right 8 mSec;

Player 5: Left 8 mSec, Right 13 mSec;

Player 6: Left 13 mSec, Right 8 mSec;

For violoncellos and contrabasses:

Player 1: Left 21 mSec, Right 34 mSec;

Player 2: Left 34 mSec, Right 21 mSec;

Player 3: Left 21 mSec, Right 34 mSec;

Player 4: Left 34 mSec, Right 21 mSec;

Player 5: Left 21 mSec, Right 34 mSec; and

Player 6: Left 34 mSec, Right 21 mSec.

NOTE: Even though a 21 mSec delay correlates to ~47.8 Hz, comb filtering will occur on only the three lowest notes in the standard contrabass range. These notes and the four extended notes below the standard range have such long wavelengths that the ear is not sensitive to comb filtering at those frequencies.

For harp:

Upper register channel: Left 8 mSec, Right 13 mSec; and

Lower register channel: Left 21 mSec, Right 34 mSec.

This discussion has assumed that the system produces two signal paths for each instrument connected to the system. If more than two signal paths are used with each instrument, the delays preferably should be arranged as follows:

Violin: 5 mSec, 8 mSec, 13 mSec, 21 mSec;

Viola: 8 mSec, 13 mSec, 21 mSec, 34 mSec;

Cello: 16 mSec, 26 mSec, 42 mSec;

Contrabass: 24 mSec, 39 mSec, 63 mSec;

Harp: 8 mSec, 13 mSec, 21 mSec, 34 mSec.

Delays longer than ~50 mSec will be perceived as a short echo rather than a single acoustical event, which may be tolerable in the contrabass register.

Optional Tone Control Equalization

Optionally, an additional processing module 7 can be inserted in series with the output of the delay module to facilitate tone control adjustment in various performing venues. Typically, this module will be a multiband parametric equalizer like the Waves Q10 equalizer plugin, the parameters of which should be ganged together with all the other players' channels and adjusted remotely from a computer or data pad in the listeners' position in the hall.

Distribution and Mixing of Signals

Using an audio matrix 8 in the VST host application like Waves SuperRack™, Plogue Bidule™, or other, assign each of the outputs of the delay module 6 or (optional, as discussed above) tone control modules 7 to an appropriate output channel as shown in FIG. 5. At this point, the discussion expands to include the channels from all thirty of the players.

In FIG. 5, the first vertical column of the table is the list of instruments being processed. Each horizontal row in the table has a check box indicating that a signal from that row has been assigned to one of the twenty-four output channels of the system going to twenty-four speakers. Each instrument has two processed outputs to assign in the matrix or table of FIG. 5, one left (L) and one right (R) as represented by Xs in the matrix. Contrabass and harp have two Xs for each channel (and thus sixteen outputs) to be reproduced. This arrangement enables a decrease in harmonic distortion by requiring a decrease in playback level of 3 dB and a subsequent reduction of diaphragm excursion of the output loudspeakers for those instruments.

The doubled contrabass speakers 12 are physically adjacent to each other in the output array to take advantage of acoustical coupling at low frequencies.

The doubled harp channels are separated in space to distribute the harp sound more evenly in the reverb field.

Some embodiments may use fewer or more than twenty-four speakers in the output array. The ideal embodiment will have one output channel and output loudspeaker for each individual signal path. This number, however, is impractical for most real-world implementations. Whatever the size of the output array, the output assignments preferably should conform to the rules below for the best aesthetic results.

1. No Two Instruments from the Same Instrumental Section should be Combined in One Output Loudspeaker.

Two instruments playing the same or nearly the same notes will suffer interference effects due to the random phase differences of the two waveforms. The resulting intermodulation distortions and their sum and difference tones will cause an unnatural sounding tone quality and a drop in system output. To ameliorate these effects, use loudspeakers that have low intermodulation distortion and wide bandwidth.

2. No More than Three Instruments' Outputs should be Combined into One Output Loudspeaker.

To ameliorate the unpleasant effects of combining multiple tones in one speaker driver, use loudspeakers that have low intermodulation distortion and wide bandwidth.

3. Locate the Output Loudspeakers on the Same Side of the Stage as the Players' Instruments.

Figure 6:
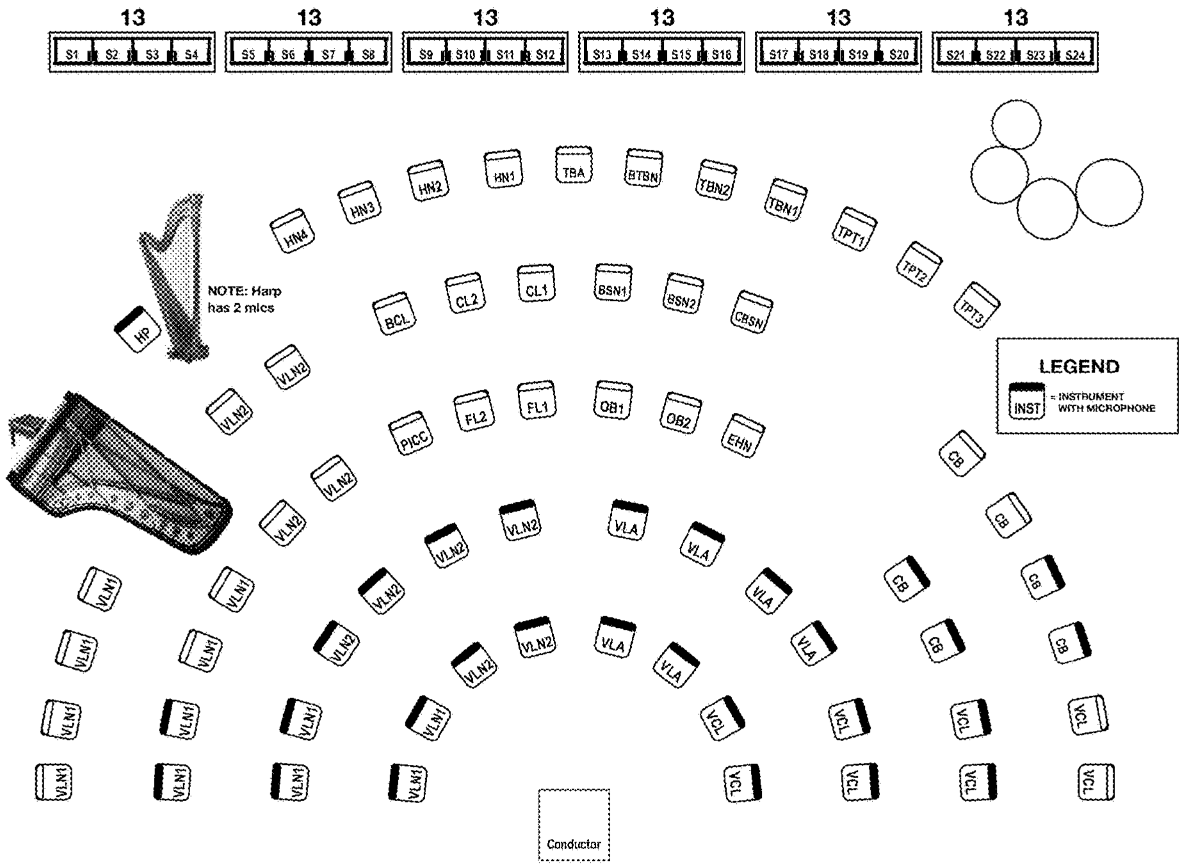
FIG. 6 is a top view of an orchestra showing the position of the output loudspeaker arrays.

FIG. 6 shows the positioning of the speakers behind the players. Players on the left side of the stage (as seen by the audience) should have their channels directed to speakers on the left side and players on the right side of the stage should have their channels directed to speakers on the right side. Players in the middle should have their channels directed to speakers closer to the middle.

For example, consider the players of the Violin 1 subsection that are provided with microphones M attached to the system 100. In FIG. 6 the positions of those players are indicated by boxes bearing the identification VLN1 and a bar at the top of each of those boxes. These players are arrayed in front and on the left side of the conductor, as seen by the audience. FIG. 5 shows the assignment of the channels to speakers as provided by the system 100. For example, VLN1-1 on the matrix of that drawing refers to the concertmaster (see Table 1), the violinist in the front rank of violinists who is closest to the conductor and also the leader of Violin 1. The two reinforcing channels created by the system 100 for the concertmaster will be assigned to speakers S6 and S12. Referring to FIG. 6, speakers S6 and S12 are behind the concertmaster.

As another example, consider the principal of the contrabass section, who is identified in FIG. 5 as CB-1. The four reinforcing channels created by the system 100 for the contrabass principal will be assigned to speakers S9, S10, S18, and S19. Referring to FIG. 6, those speakers are distributed between the center and right of the stage, whereas the other contrabasses (CB-2 to CB-4) will have speakers distributed more to the right side of the stage as viewed by the audience and corresponding to their physical positioning on the stage as seen by the audience.

Even in acoustic environments where the reverberant field predominates, the ear has some ability to discern the source of direct sound rays and early reflections. Placing the loudspeaker at or near the same angle from the listeners' point of view will preserve the perception that the source of sound is the live unreinforced player.

For contrabass and harp, or any other instrument that uses two loudspeakers per signal output, decrease the gain of those channels by 3 dB (half power) compared to the single speaker signals to retain equal power balance between the string sections.

Output Section

Speaker Equalization Module

The outputs of each channel of the audio matrix are connected to an individual speaker equalization module 9 that convolves the audio signal with the inverse transfer characteristic of the downstream loudspeaker. This step ensures that the acoustic output of the system has an optimally neutral power response. For the most natural sounding effect, the power response of the optimally corrected loudspeaker preferably should be 32 to 10,000 Hz±1 dB measured at three meters from the loudspeaker. It is also recommended that the speaker arrays be calibrated in an anechoic environment (such as outdoors with no reflecting surfaces nearby) to allow variations in room acoustics to color the output of System 100 in the same way as they color the live instruments in the ensemble, thereby preserving the natural qualities of the string section.

Power Amplifier

The output of each speaker equalization module 9 is connected to its own digital to analog converter 10 and power amplifier 11. The required power output is the amount needed to drive the output loudspeaker with pink noise to the level of 100 dB SPL RMS measured at one meter from the speaker array plus an additional 3 dB of headroom.

Example: speaker broadband sensitivity=85 dB at 1 meter. Amount of power required to produce pink noise at 100 dB SPL plus 3 dB of headroom at 1 meter=63 Watts.

Loudspeaker Array

The amplified signal for each channel of the output section is conveyed to its respective loudspeaker or output transducer pair 12. In the discussion above, twenty-four output channels are provided and preferably each channel will go to its own speaker, thus requiring twenty-four speakers in twelve loudspeaker pairs. FIG. 6 shows the disposition of the individual speakers S1-S24.

The specifications of the loudspeakers in the output array 13 preferably are:

1. Polar pattern: omnidirectional over the frequencies of interest. A dipole with flat power response can be an acceptable substitute.
2. Maximum Power: able to sustain 100 dB SPL pink noise at 1 meter indefinitely.
3. Frequency response (uncorrected): ±3 dB @42 Hz and 10 KHz
4. Harmonic Distortion: ≤1% from 65 Hz to 8 KHz at 90 dBA The individual loudspeakers in the array should be evenly distributed across the stage as shown in FIG. 6. If required, the array can be positioned close to the instruments being reinforced without causing feedback due to the detuning and delay in each channel.

The output of the system should be adjusted so that it is perceived as part of the diffuse reverb field rather than a source of direct sound. The loudness and tonal balance of the system's output should be adjusted in the venue so that it blends imperceptibly with the string sections of the orchestra. When properly balanced, the strings will be in equal balance with the brass, woodwinds, and percussion in the loudest passages of the music. When properly balanced, in the quietest passages for only string instruments, the reinforcement system 100 will be undetectable from the audience point of view.

Using the System in a Recording Application

Another application of the system of this disclosure is to record the multiple output signals generated by the system 100 to individual tracks in a computer-based digital audio workstation or other digital recording device or medium. The signals referred to are those at the output of the digital audio matrix 8.

Figure 7:
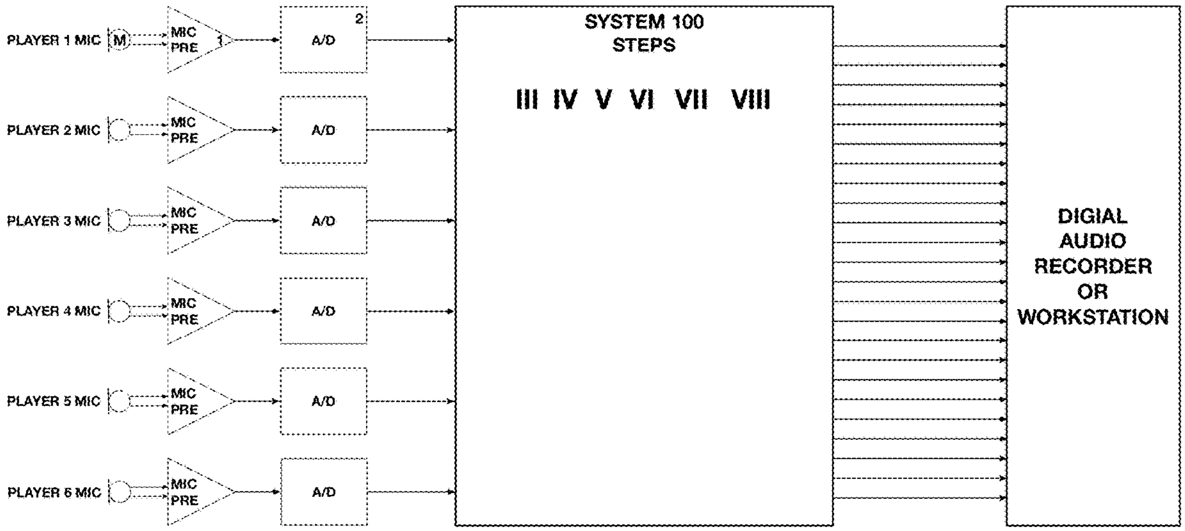
FIG. 7 is a schematic of an embodiment of signal processing for six input channels for recording.

Storing the plurality of these outputs as individual recorded tracks as shown in FIG. 7 would allow the music producer to individually pan, mix, and place each track in the simulated reverb space of his or her binaural, stereo, or multitrack recording, thereby creating a realistic simulated string section sound in far less time and expense than overdubbing a few live players.

Figure 8:
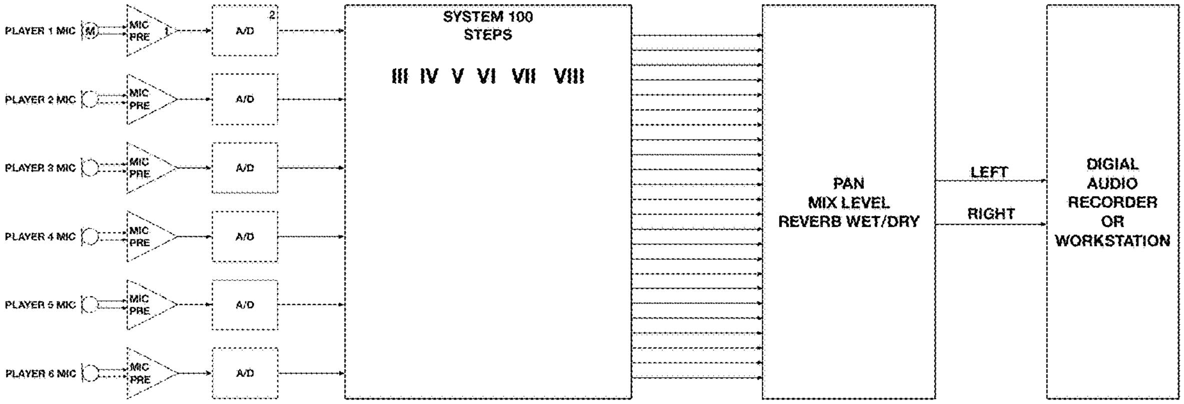
FIG. 8 is a schematic of an alternative embodiment of signal processing for six input channels for recording.

A further refinement would be to record the processed output channels to a stereo mix (known as bouncing the tracks to a stereo sub-mix.) In this embodiment, as shown in FIG. 8, the software application would also include pan, mix, and reverb wet/dry ratio modules for each processed signal, resulting in a mono, binaural, stereo, or multichannel mix.

Using the Invention with a Chorus of Human Voices

The system 100 may be used as described herein to process any group of instruments that are playing the same musical part including but not limited to string instruments, wind instruments, and the human voice.

The use of live tuning correction, chorusing, detuning, delay, and frequency equalization are commonly used in live performance as well as recording studios to double or fatten the sound of the human voice. The primary differences between this conventional approach and system 100 are as follows.

In system 100, the input signals are not mixed into one or two output channels after processing. Rather they are multiplied and separated in aural space. The splitting of input signals into a plurality of processed output signals which are individually radiated at different locations in the performance space preserves the natural ratio of direct to diffused sound in that acoustic space and thereby the spatial and aesthetic characteristics of a real choir.

The amount of pitch shift in the plurality of output channels is chosen to approximate a normal distribution of energy above and below the center of the desired reference pitch thus preserving the natural pitch distribution of a real choir. In common practice, the amount of pitch shift used is arbitrary and, when the outputs are summed into one or two channels, has destructive and constructive resonances, which often sound artificial and unmusical.

The delay used to de-correlate the various output channels from each other is calculated based on Phi ($\phi$) to avoid destructive and constructive resonances which emphasize and de-emphasize parts of the pass band. In common practice, the delays used are arbitrary, and when summed together have destructive and constructive resonances that often sound artificial and unmusical.

The invention is intended to cover alternatives, modifications and equivalents that may be included within the spirit and scope of the invention as defined by the appended claims. For example, the system and method of reinforcement described above could be implemented in a special-purpose computer configured with software configured to implement the functions of the plug-ins of the preferred embodiment described in this specification. The system and method of reinforcement may be provided for musical instruments other than string instruments. The system and method of reinforcement may be used with vocal performers to make a small chorus sound like a larger chorus.

What is claimed is:

1. A system for processing audio signals comprising:
- a plurality of instrument microphones or other acoustic transducers,
- a multi-channel microphone preamplifier or other multi-channel gain stage to amplify the outputs of the transducers,
- a multi-channel analog to digital converter to digitize the signals,
- a computer or other digital signal processing system running software modules configured to:
  - divide each input signal into a plurality of channels,
  - pitch shift the original signal in each channel by a unique amount such that a spectral analysis of the sum of the plurality of all its channels would contain a normal distribution of many spectral components in the sidebands above and below the fundamental pitch and harmonics of the original signal,
  - delay the signal in each channel by an amount that is a multiple of Phi (φ, 1.618033 . . . ) or other irrational number or prime number such that the transfer characteristic of the sum of the plurality of channels would be frequency linear due to the absence of reinforcing or cancelling spectral components,
  - assign each of the plurality of channels via a digital audio matrix to specific output channels,
  - convolve each output channel signal with the inverse transfer characteristic of its respective output loudspeaker,
- a multi-channel digital to analog converter to restore the output channels to analog audio,
- a bank of power amplifiers with sufficient channels to drive an array of output transducers,
- wherein each output transducer is located at a position in space uniquely different from the others of the plurality of channels, each radiating the sound of its assigned output channel.

2. The system for processing audio signals according to claim 1 wherein the instrument microphones or other acoustic transducers are attached to musical instruments assembled in an ensemble.

3. The system for processing audio signals according to claim 2 wherein the instrument microphones or other acoustic transducers are attached to musical instruments of a plurality of members of a string section of an orchestra assembled in an ensemble.

4. The system for processing audio signals according to claim 1 wherein the instrument microphones or other acoustic transducers are attached to a plurality of singers.

5. A method for processing audio signals whereby a single input signal is:
- captured by a microphone or other transducer or generated electronically or by digital synthesis,
- amplified by a microphone preamplifier or other gain stage,
- converted from an analog to a digital signal,
- divided into a plurality of processing channels,
- pitch shifted in each of the processing channels by a unique amount such that a spectral analysis of the sum of the plurality of all its channels would contain a normal distribution of many spectral components in the sidebands above and below the fundamental pitch and harmonics of the original signal,
- delayed in each of the processing channels by an amount that is a multiple of Phi (φ, 1.618033 . . . ) or other irrational number or prime number such that the transfer characteristic of the sum of the plurality of channels would be frequency linear due to the absence of reinforcing or cancelling spectral components, and
- assigned in each processing channel via a digital audio matrix to specific output channels.

6. The method for processing audio signals according to claim 5 in which a plurality of input signals is simultaneously and individually processed.

7. The method for processing audio signals according to claim 5,
- wherein the output channels are convolved with the inverse transfer characteristic of each channel's respective output loudspeaker or array of other transducers,
- reconverted to the analog domain,
- amplified by a power amplifying gain stage, and
- output by a loudspeaker array or array of other transducers.

8. The method for processing audio signals according to claim 5 in which the outputs of the processing channels are individually recorded and stored on a digital medium.

9. The method for processing audio signals according to claim 5 resulting in the summing of each of the plurality of the output of the processing channels into one or more master output channels.

10. The method for processing audio signals according to claim 6 resulting in the summing of each of the plurality of the output of the processing channels into one or more master output channels.

11. The method for processing audio signals according to claim 7 in which a plurality of input signals is simultaneously and individually processed.

12. The method for processing audio signals according to claim 7 in which the input signal is the sum of a plurality of unique individual signals.

13. The method for processing audio signals according to claim 5 wherein the input audio signal is provided by the playing of a musical instrument.

14. The method for processing audio signals according to claim 6 wherein a plurality of input audio signals is provided by the playing of a plurality of musical instruments.

15. The method for processing audio signals according to claim 14 wherein the plurality of input audio signals is provided by the playing of a plurality of musical instruments at the same time as part of an ensemble.

16. The method for processing audio signals according to claim 15 wherein the plurality of musical instruments are members of the string section of an orchestra.

17. The method for processing audio signals according to claim 5 wherein the input audio signal is provided by the voice of a singer.

18. The method for processing audio signals according to claim 17 wherein a plurality of input audio signals is provided by the voices of a plurality of singers.

19. The method for processing audio signals according to claim 18 wherein the plurality of input audio signals is provided by the voices of a plurality of singers assembled in an ensemble such as a choir.

20. A system for processing audio signals comprising:
- a plurality of instrument microphones or other acoustic transducers, a multi-channel microphone preamplifier or other multi-channel gain stage to amplify the outputs of the transducers, a multi-channel analog to digital converter to digitize the signals, a computer or other digital signal processing system running software modules configured to:

divide each input signal into a plurality of channels, pitch shift the original signal in each channel by a unique amount such that a spectral analysis of the sum of the plurality of all its channels would contain a normal distribution of many spectral components in the sidebands above and below the fundamental pitch and harmonics of the original signal, delay the signal in each channel by an amount that is a multiple of Phi (φ, 1.618033 . . . ) or other irrational number such that the transfer characteristic of the sum of the plurality of channels would be frequency linear due to the absence of reinforcing or cancelling spectral components, assign each of the plurality of channels via a digital audio matrix to specific output channels, convolve each output channel signal with the inverse transfer characteristic of its respective output loudspeaker, a multi-channel digital to analog converter to restore the output channels to analog audio, a bank of power amplifiers with sufficient channels to drive an array of output transducers, wherein each output transducer is located at a position in space uniquely different from the others of the plurality of channels, each radiating the sound of its assigned output channel.

* * * * *